United States Patent
Yano et al.

(10) Patent No.: US 8,990,458 B2
(45) Date of Patent: Mar. 24, 2015

(54) CONTROLLER, SEMICONDUCTOR STORAGE DEVICE AND METHOD OF CONTROLLING DATA WRITING

(71) Applicant: Kabushiki Kaisha Toshiba, Minato-ku (JP)

(72) Inventors: Hirokuni Yano, Tokyo (JP); Mitsunori Tadokoro, Fujisawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 79 days.

(21) Appl. No.: 13/910,376

(22) Filed: Jun. 5, 2013

(65) Prior Publication Data

US 2014/0244903 A1      Aug. 28, 2014

Related U.S. Application Data

(60) Provisional application No. 61/770,374, filed on Feb. 28, 2013.

(51) Int. Cl.
| | |
|---|---|
| *G06F 3/00* | (2006.01) |
| *G06F 13/00* | (2006.01) |
| *G06F 12/02* | (2006.01) |
| *G06F 3/06* | (2006.01) |
| *G11C 11/56* | (2006.01) |

(52) U.S. Cl.
CPC .......... *G06F 12/0246* (2013.01); *G06F 3/0659* (2013.01); *G11C 11/5621* (2013.01); *G11C 11/5628* (2013.01); *G11C 2211/5641* (2013.01)
USPC .................................. 710/62; 710/18; 710/33

(58) Field of Classification Search
None
See application file for complete search history.

(56) References Cited

U.S. PATENT DOCUMENTS

| | | |
|---|---|---|
| 2010/0037009 A1 | 2/2010 | Yano et al. |
| 2010/0037010 A1 | 2/2010 | Yano et al. |
| 2010/0037011 A1 | 2/2010 | Yano et al. |
| 2010/0037012 A1 | 2/2010 | Yano et al. |
| 2010/0265768 A1 | 10/2010 | Kasuga |
| 2011/0141811 A1* | 6/2011 | Shimizu et al. .......... 365/185.03 |
| 2011/0238899 A1 | 9/2011 | Yano et al. |
| 2011/0314204 A1 | 12/2011 | Ootsuka et al. |
| 2012/0033496 A1 | 2/2012 | Yano et al. |
| 2012/0079167 A1 | 3/2012 | Yao et al. |

(Continued)

FOREIGN PATENT DOCUMENTS

| | | |
|---|---|---|
| JP | 2010-157142 | 7/2010 |
| JP | 2012-68986 | 4/2012 |
| WO | WO 2009/090731 A1 | 7/2009 |

*Primary Examiner* — Zachary K Huson
(74) *Attorney, Agent, or Firm* — Oblon, McClelland, Maier & Neustadt, L.L.P.

(57) ABSTRACT

According to one embodiment, a memory controller includes a mode selection part that selects one of a MLC-mode and a SLC-mode, after a write command is decoded by a command decode part, and a write part that executes a data writing to a storage memory by using one of the MLC-mode and the SLC-mode selected by the mode selection part. The mode selection part is configured to check whether a first data wrote from a host to a buffer memory is a time-continuous data that is wrote continuously during a predetermined period, execute the data writing of a second data from the buffer memory to the storage memory in the MLC-mode, when the first data is the time-continuous data, and execute the data writing of the second data from the buffer memory to the storage memory in the SLC-mode, when the first data is not the time-continuous data.

20 Claims, 19 Drawing Sheets

(56) References Cited

U.S. PATENT DOCUMENTS

| | | |
|---|---|---|
| 2012/0311245 A1 | 12/2012 | Yano et al. |
| 2013/0227246 A1 | 8/2013 | Hirao et al. |
| 2013/0232296 A1 | 9/2013 | Yonezawa et al. |
| 2013/0275650 A1 | 10/2013 | Hida et al. |

* cited by examiner

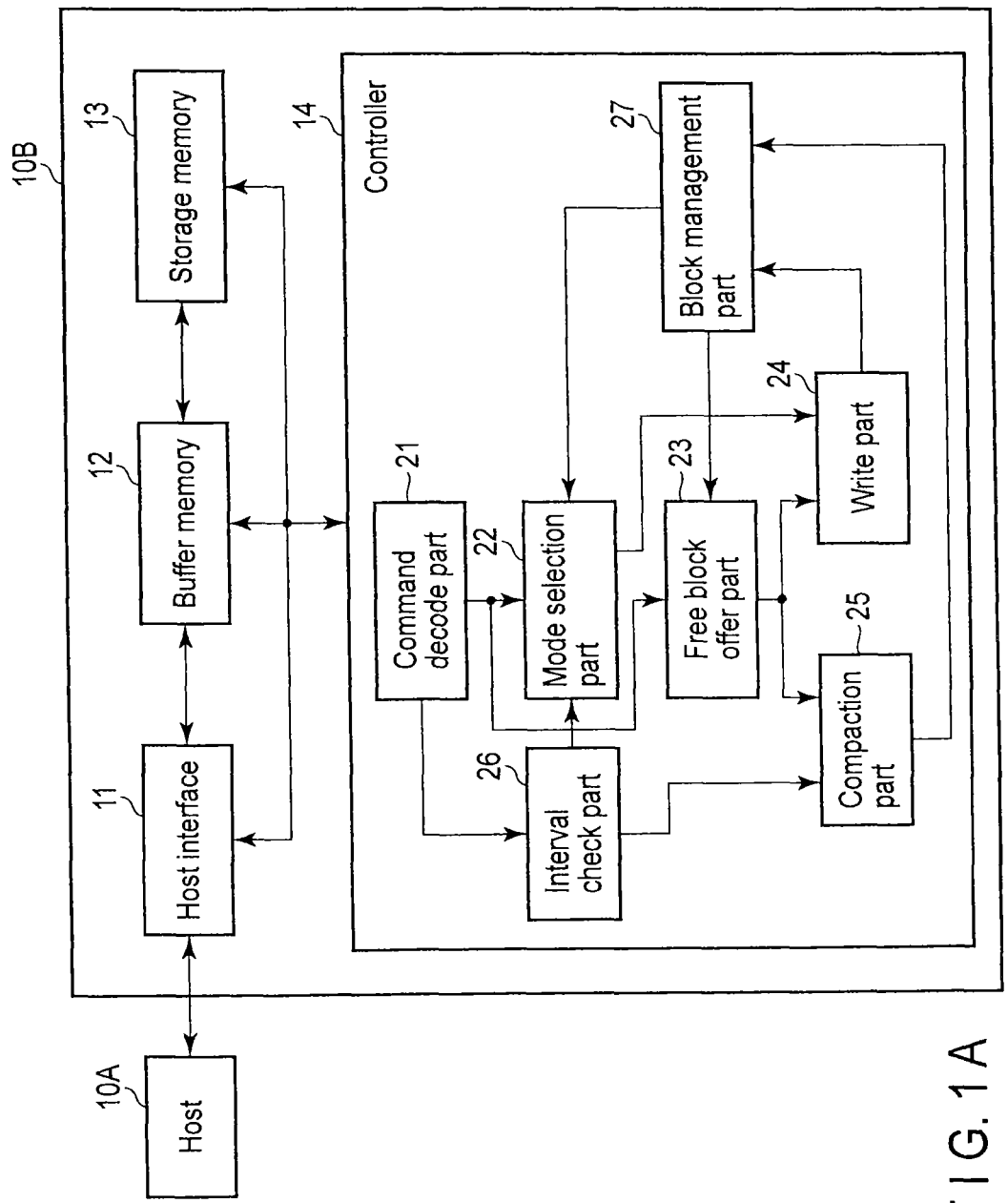
F I G. 1 A

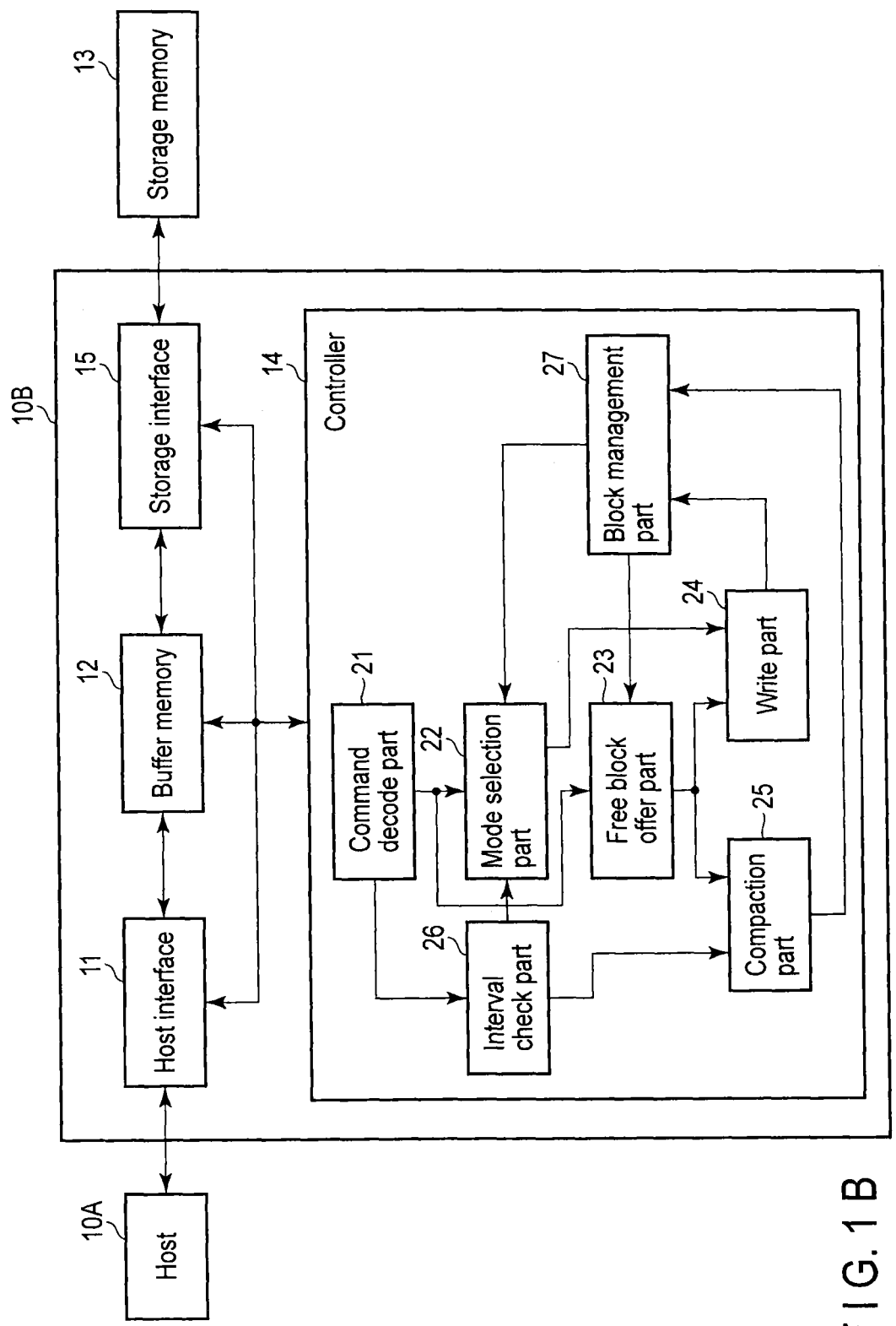
F I G. 1 B

Block management table

| Block number | Statement |
|---|---|
| 1 | S |
| 2 | S |
| 3 | M |
| 4 | F |
| 5 | M |
| ⋮ | ⋮ |
| n−1 | F |
| n | F |

S: SLC−Active block
M: MLC−Active block
F: Free block

FIG. 3

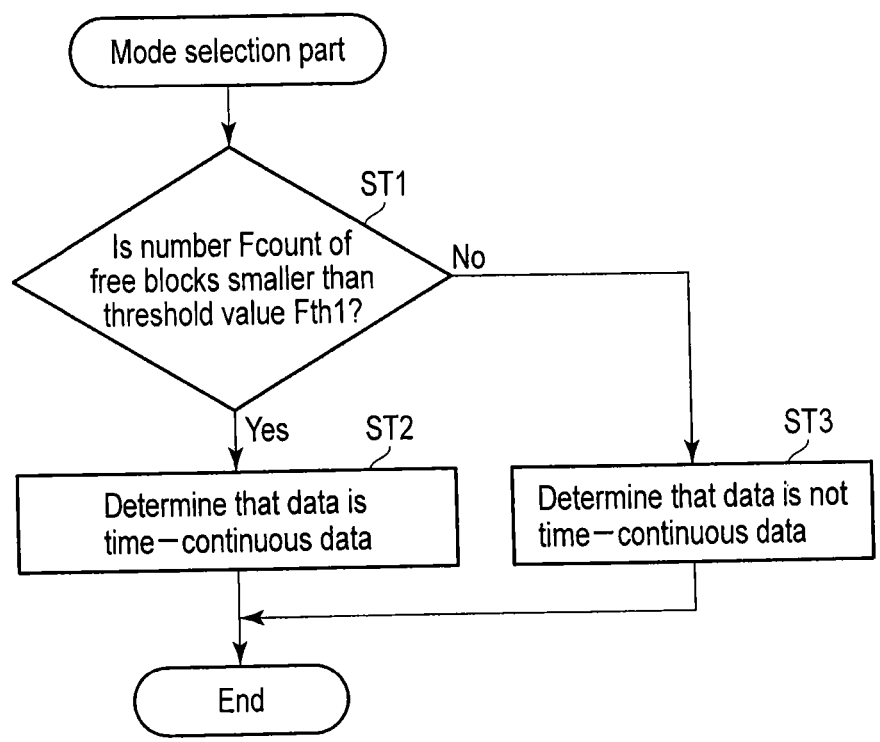
F I G. 5

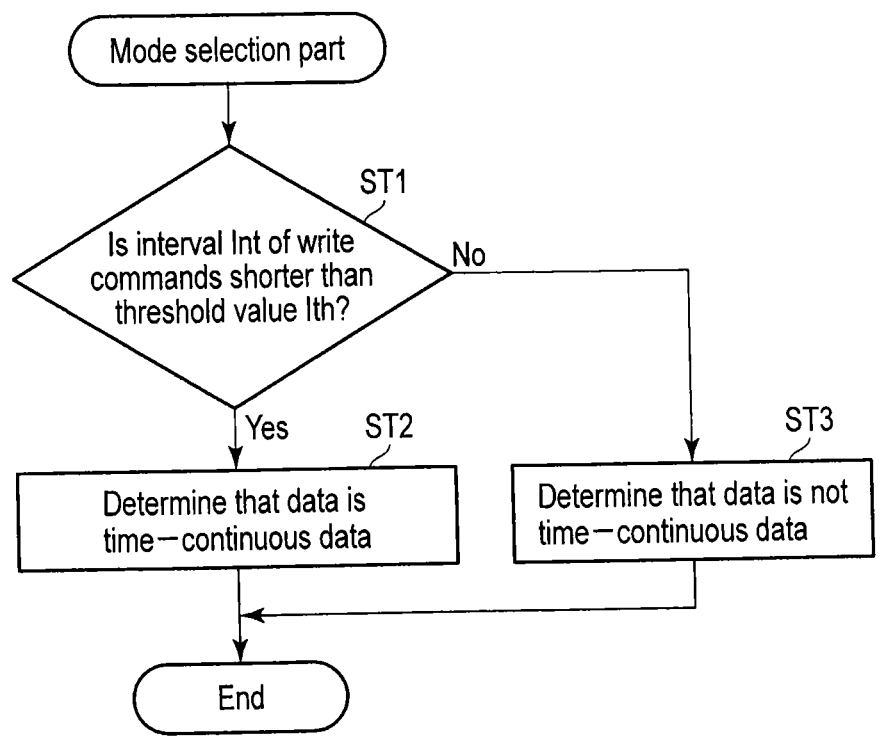
F I G. 6

Block management table

| Block number | Statement | Number of write/erase times |
|---|---|---|
| 1 | S | N1 |
| 2 | S | N2 |
| 3 | M | N3 |
| 4 | F | N4 |
| 5 | M | N5 |
| ⋮ | ⋮ | ⋮ |
| n−1 | F | N(n−1) |
| n | F | Nn |

S: SLC−Active block
M: MLC−Active block
F: Free block

FIG. 10

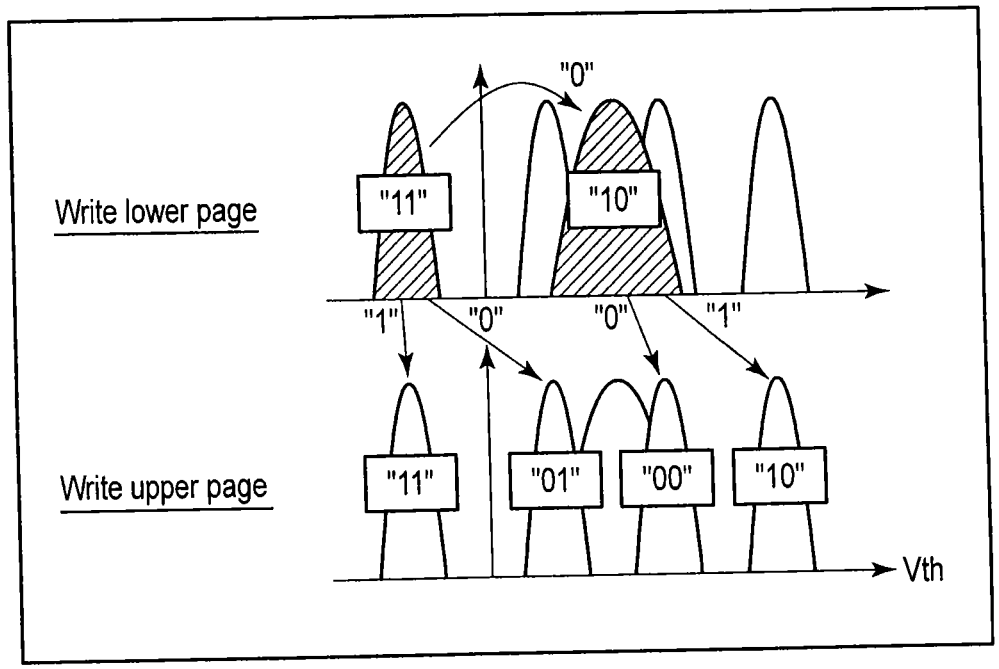
F I G. 14

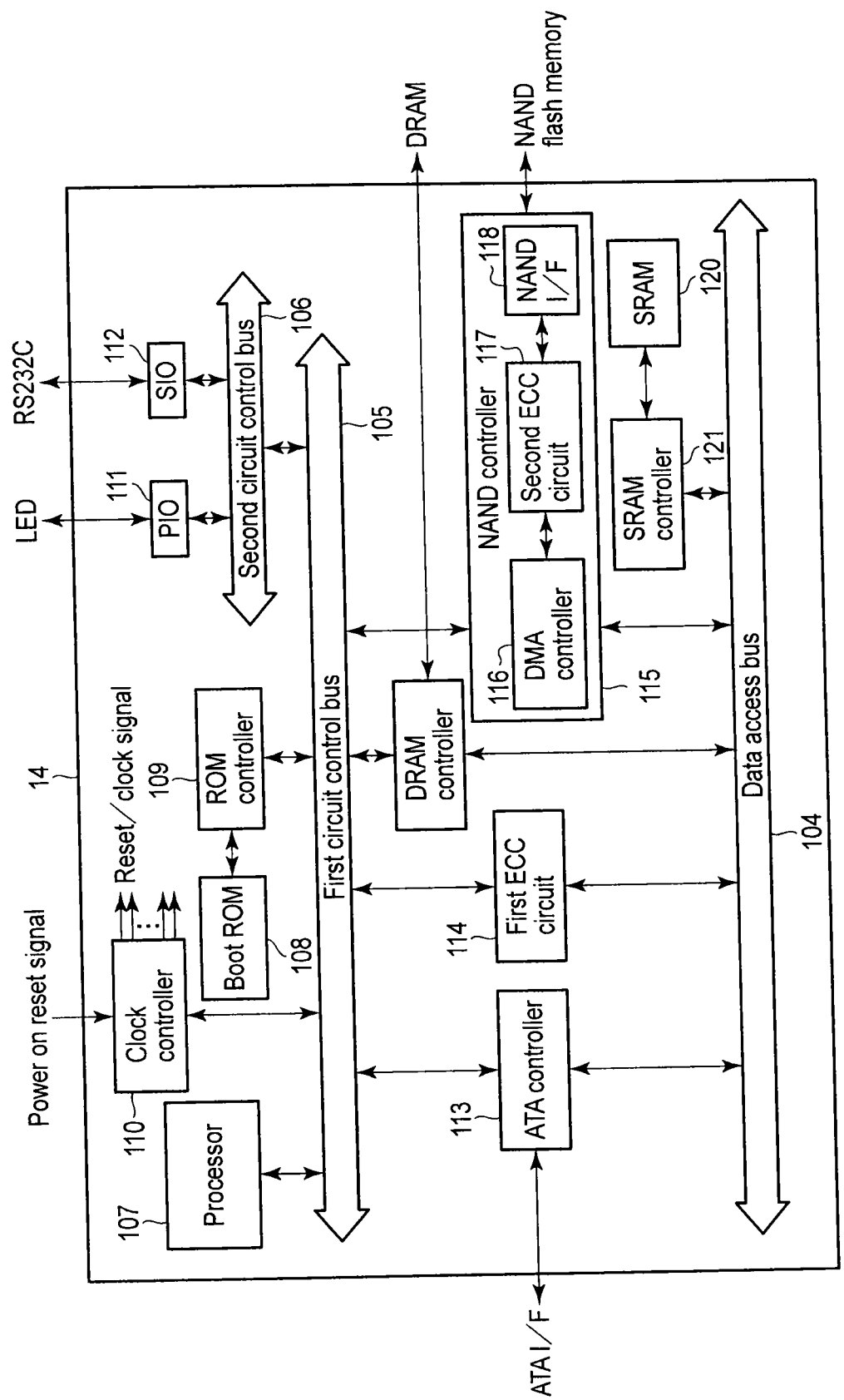
F I G. 15

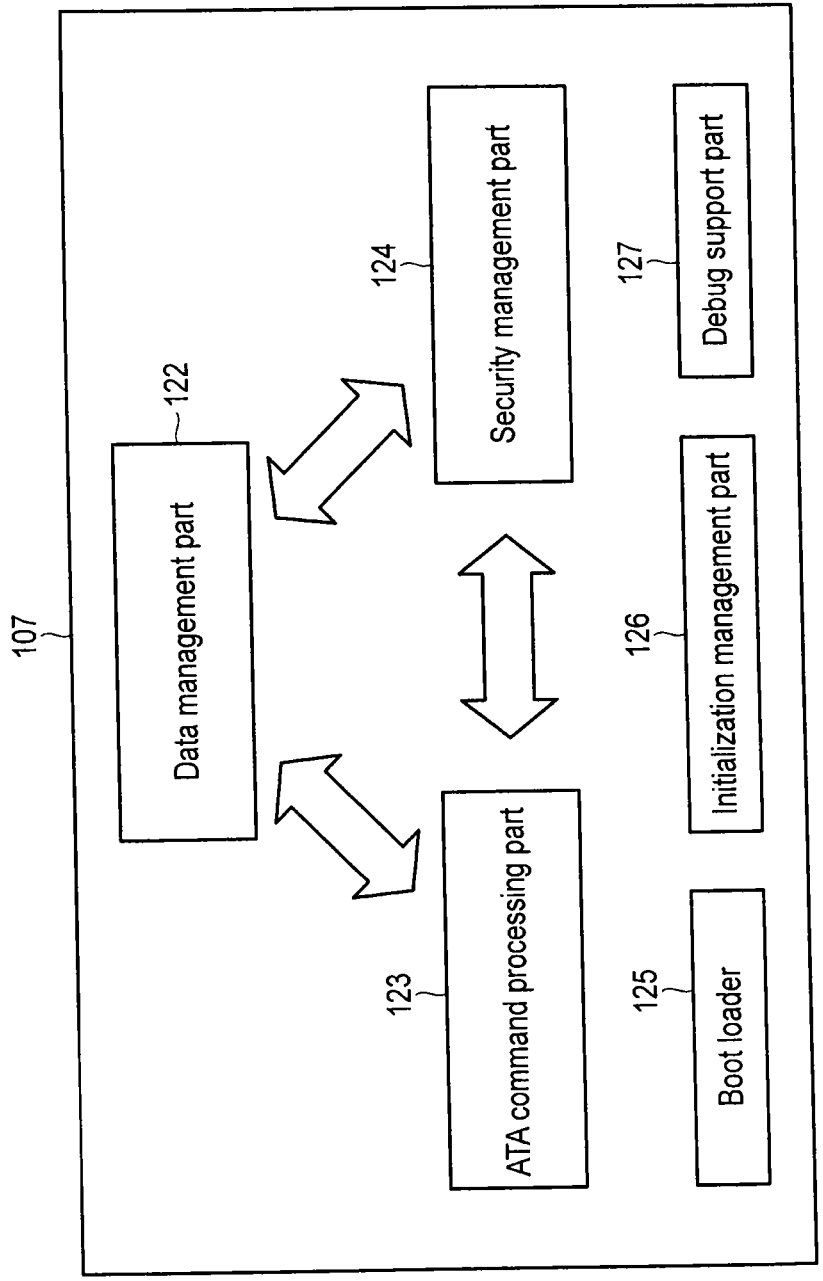
F I G. 16

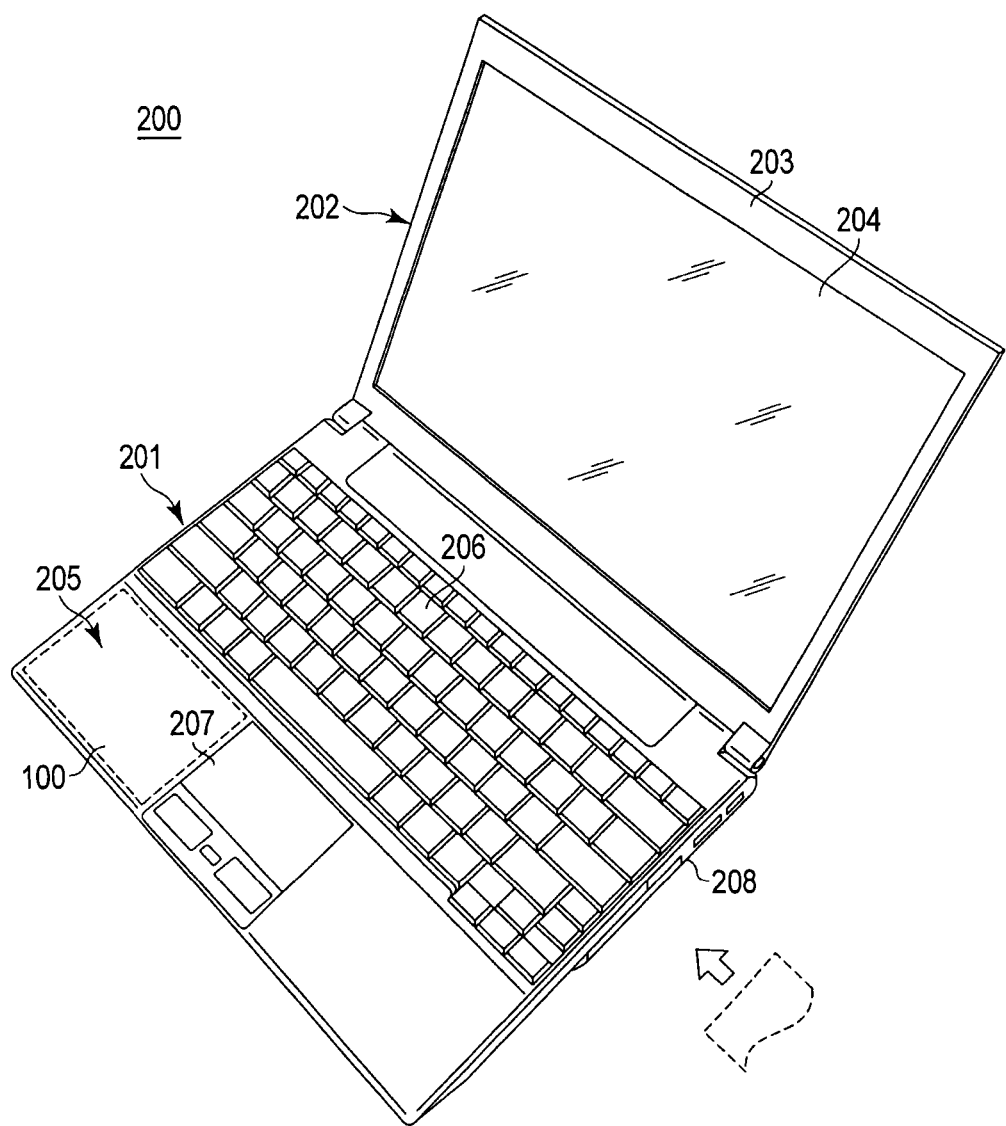
F I G. 17

CONTROLLER, SEMICONDUCTOR STORAGE DEVICE AND METHOD OF CONTROLLING DATA WRITING

CROSS-REFERENCE TO RELATED APPLICATIONS

This application claims the benefit of U.S. Provisional Application No. 61/770,374, filed Feb. 28, 2013, the entire contents of which are incorporated herein by reference.

FIELD

Embodiments described herein relate generally to a controller, a semiconductor storage device and a method of controlling a data writing.

BACKGROUND

A memory system that uses a nonvolatile memory such as a NAND flash memory as a storage device has a single level cell (SLC)-mode in which binary data (1-bit data) is written in a memory cell of the nonvolatile memory and a multi level cell (MLC)-mode in which multivalued data (data of 2 or more bits) is written in a memory cell of the nonvolatile memory.

The SLC-mode is preferable to write data in the nonvolatile memory at a high speed. However, the number of free blocks as a free space speedily decreases during the writing in the SLC-mode. For this reason, when data is continuously written, a compaction readily occurs during the writing and leads to a decrease in the write speed.

On the other hand, during the writing in the MLC-mode, the number of free blocks moderately decreases. For this reason, even if data is continuously written, the compaction rarely occurs during the writing, and the write speed is stable. However, the write speed in the MLC-mode is lower than that in the SLC-mode without the compaction, as a matter of course.

Hence, the performance of the memory system is influenced by whether the SLC-mode and the MLC-mode are appropriately selected.

BRIEF DESCRIPTION OF THE DRAWINGS

FIGS. 1A and 1B are block diagrams showing a memory system;

FIG. 3 is a view showing a block management table;

FIGS. 5 and 6 are flowcharts showing the mode selection part;

FIG. 10 is a view showing a block management table;

FIG. 14 is a view showing the threshold distribution of SLC and MLC;

FIG. 15 is a block diagram showing a controller;

FIG. 16 is a block diagram showing a processor in the controller;

FIG. 17 is a perspective view showing a portable computer; and

DETAILED DESCRIPTION

Figure 2:
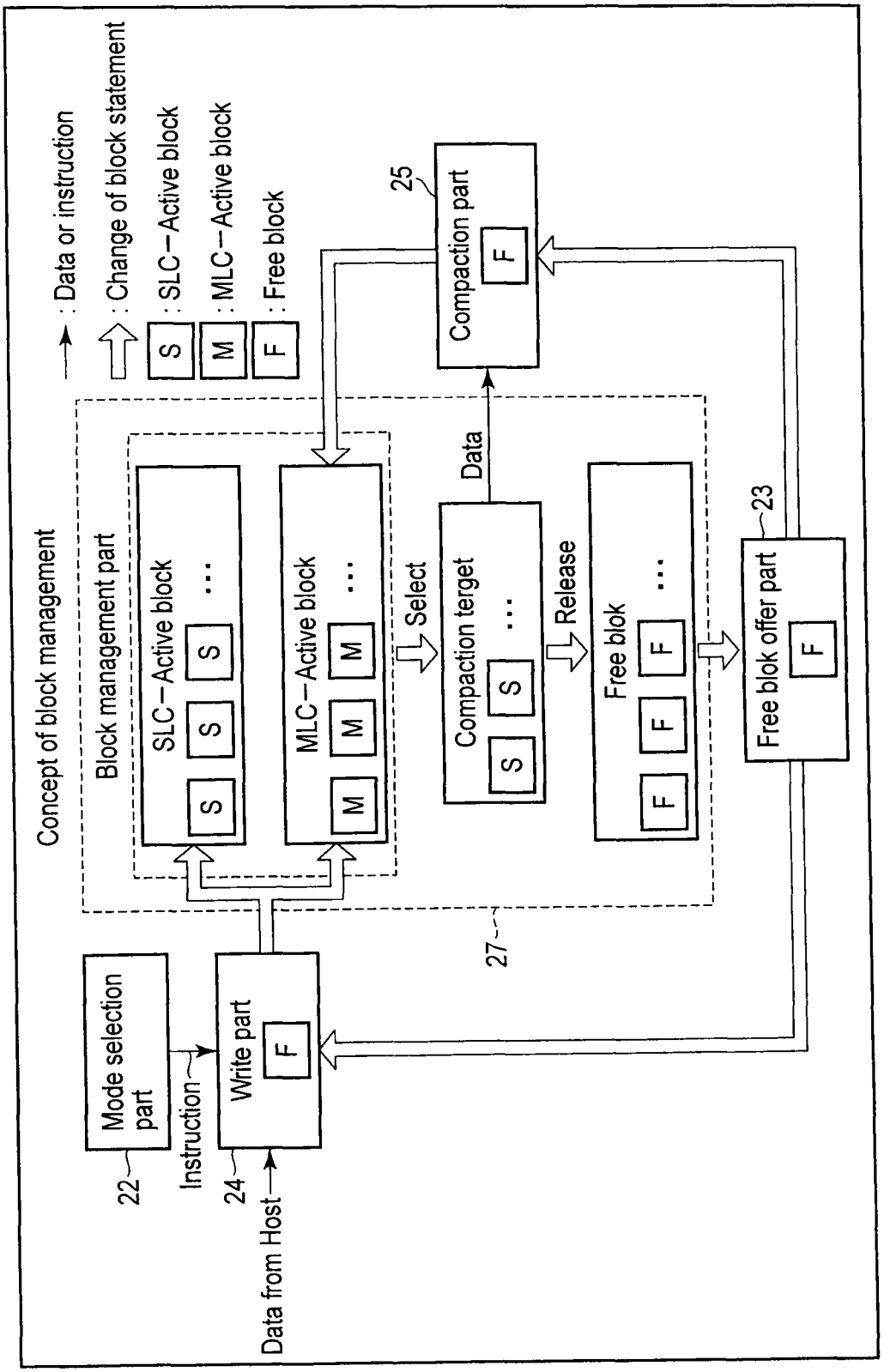
FIG. 2 is a view showing the concept of block management.

In general, according to one embodiment, a memory controller comprising: a command decode part; a mode selection part that selects one of a MLC-mode and a SLC-mode, after a write command is decoded by the command decode part; and a write part that executes a data writing to a storage memory by using one of the MLC-mode and the SLC-mode selected by the mode selection part. The mode selection part is configured to: check whether a first data wrote from a host to a buffer memory is a time-continuous data that is wrote continuously during a predetermined period; execute the data writing of a second data from the buffer memory to the storage memory in the MLC-mode, when the first data is the time-continuous data; and execute the data writing of the second data from the buffer memory to the storage memory in the SLC-mode, when the first data is not the time-continuous data.

1. RELATIONSHIP BETWEEN WRITING AND COMPACTION

The SLC-mode features high speed writing, and the MLC-mode features large capacity writing. Hence, when the number of free blocks as a free space in a nonvolatile memory serving as a storage device is large, a writing is preferably performed in the SLC-mode to improve the performance of the memory system.

However, the number of free blocks speedily decreases during the writing in the SLC-mode. For this reason, when the number of free blocks is small, it is necessary to perform a compaction of rewriting data written in the SLC-mode again in the MLC-mode to increase the number of free blocks. This compaction lowers the write speed (write efficiency) in the SLC-mode.

For example, assume that the MLC-mode is a 4 level cell mode in which quaternary data (2-bit data) is written in a memory cell, and the number of blocks needed to write data from a host in the MLC-mode (4 level cell mode) is 1. In this case, first, the writing is performed in two blocks in the SLC-mode. Then, a rewriting is performed in one block in the MLC-mode.

In this case, since the data from the host needs to be written in the total of three blocks, the write speed (write efficiency) consequently lowers. Additionally, in this case, since the number of block use times increases, the life of the block shortens.

2. TIME-CONTINUOUS DATA

As described above, the write speed (write efficiency) is influenced not only by selection of the SLC-mode and MLC-mode but also by whether a compaction occurs during writing. On the other hand, occurrence of the compaction supposedly greatly depends on the characteristic of data to be written from the host to the nonvolatile memory, for example, whether the data is time-continuous data.

In the embodiments to be described below, whether to perform a writing in the MLC-mode or SLC-mode is determined based on whether data to be written from the host to the nonvolatile memory is time-continuous data. Time-continuous data is defined as data continuously written in the nonvolatile memory during a predetermined period.

For example, when a controller judges that data is time-continuous data, a writing is executed in the MLC-mode.

That is, since time-continuous data has a large size (data capacity) if this data is stored in the nonvolatile memory in the SLC-mode, the number of free blocks speedily decreases, and a compaction occurs at a high possibility. To prevent this, when data is time-continuous data, the data is written in the nonvolatile memory in the MLC-mode, thereby stabilizing the write speed.

On the other hand, when the controller judges that data is not time-continuous data, a writing is executed in the SLC-mode. That is, when the possibility that a compaction occurs is low, the data is written in the nonvolatile memory in the SLC-mode, thereby improving the write speed. At the time of idle after the end of the writing in the SLC-mode, for example, the number of free blocks is increased by the compaction.

The following embodiments also propose a technique of simply judging whether data is time-continuous data. If this judgment is complex, overhead needed for the judgment occurs, and the write speed lowers independently of whether the writing is done in the SLC-mode or MLC-mode.

For example, whether data is time-continuous data can simply be judged by the number of free blocks. This is based on the fact that a compaction occurs when the number of free blocks is smaller than predetermined value (threshold value) Fth2 during writing.

That is, when the number of free blocks is smaller than threshold value Fth2, the compaction is executed in parallel to the writing. However, when the data is time-continuous data, the data is continuously written. For this reason, even if the compaction is executed in parallel to the writing, the decrease in the number of free blocks caused by the writing is larger than the increase in the number of free blocks caused by the compaction, and the number of free blocks gradually decreases.

It is therefore possible to judge whether data is time-continuous data by, for example, judging whether the number of free blocks is smaller than predetermined value (threshold value) Fth1.

Note that threshold value Fth1 can be the same as threshold value Fth2 (Fth1=Fth2) or different from threshold value Fth2. When threshold value Fth1 is different from threshold value Fth2, a relationship Fth1<Fth2 is satisfied.

3. EMBODIMENTS

FIGS. 1A and 1B show a memory system.

This memory system is applied to, for example, a semiconductor storage device such as an SSD (Solid State Drive) or a memory card. An example of a general memory system including a memory card will be explained here, and a detailed system will be described later in the section of application example.

Host 10A is, for example, the CPU (Central Processing Unit) of a portable computer, a cellular phone, a PDA (personal digital assistant), a digital still camera, a digital video camera, or the like.

Semiconductor storage device 10B is, for example, a storage device (secondary storage device or external storage device) such as an SSD or memory card.

Semiconductor storage device 10B includes host interface 11, buffer memory 12, and controller 14.

In FIG. 1A, semiconductor storage device 10B includes storage memory 13. In this case, controller 14 controls host interface 11, buffer memory 12, and storage memory 13.

In FIG. 1B, semiconductor storage device 10B includes storage interface 15. In this case, storage memory 13 is connected to storage interface 15. Controller 14 controls host interface 11, buffer memory 12, and storage interface 15.

Host 10A is connected to host interface 11. Buffer memory 12 functions as a write buffer that temporarily stores first data from host 10A. Buffer memory 12 is a random access memory having a write speed higher than that of storage memory 13. Storage memory 13 is a nonvolatile memory having a memory capacity larger than that of buffer memory 12.

Storage memory 13 stores second data from buffer memory 12. Storage memory 13 has a function of writing binary data (1-bit data) in a memory cell when the SLC-mode is selected. Storage memory 13 also has a function of writing multivalued data (data of 2 bits or more) in a memory cell when the MLC-mode is selected.

Controller 14 includes command decode part 21, mode selection part 22, free block offer part 23, write part 24, compaction part 25, interval check part 26, and block management part 27.

Command decode part 21 decodes a command from host 10A.

After a write command is decoded by command decode part 21, mode selection part 22 selects one of the MLC-mode and the SLC-mode. The criterion to judge whether to select the MLC-mode or SLC-mode is, for example, as follows.

When the first data to be written from host 10A to buffer memory 12 is time-continuous data, the writing of the second data from buffer memory 12 to storage memory 13 is performed in the MLC-mode.

When the first data to be written from host 10A to buffer memory 12 is not time-continuous data, the writing of the second data from buffer memory 12 to storage memory 13 is performed in the SLC-mode.

Whether data is time-continuous data can be judged by, for example, monitoring the first data from host 10A. In this case, overhead needed for the judgment occurs. To prevent this, whether data is time-continuous data is judged simply by, for example, the number of free blocks in storage memory 13.

For example, mode selection part 22 confirms number Fcount of free blocks in storage memory 13 based on management information of block management part 27, and determines that the first data is time-continuous data when number Fcount of free blocks in storage memory 13 is smaller than first threshold value Fth1.

Alternatively, for example, based on the information of interval check part 26, mode selection part 22 may confirm interval Int of write commands from host 10A, and determine that the first data is time-continuous data when interval Int is smaller than predetermined value Ith.

Interval check part 26 is, for example, a timer. In this case, every time command decode part 21 decodes a write command, the count value of the timer is reset (for example, count value=0). After the reset, the count value of the timer increases at a predetermined interval as the time elapses.

It is therefore possible to confirm interval Int of write commands by confirming the count value of the timer when the write command is decoded.

After the write command is decoded by command decode part 21, free block offer part 23 determines a free block in storage memory 13 to write the second data based on management information of block management part 27.

Using one of the MLC-mode and SLC-mode selected by mode selection part 22, write part 24 writes the second data in the free block of storage memory 13 offered by free block offer part 23.

Block management part 27 updates the statement of each free block in which the second data is written. That is, when the second data is written in the MLC-mode, the statement of the block is changed from F (Free block) to M (MLC-active block). When the second data is written in the SLC-mode, the statement of the block is changed from F (Free block) to S (SLC-active block).

Compaction part 25 executes a compaction of third data written in storage memory 13.

A compaction indicates an operation of putting together data distributed and stored in storage memory 13. In particular, the compaction is effective as a means for suppressing an abrupt decrease in the free space (free blocks) caused by an increase in the data rewrite count in a nonvolatile memory such as a NAND flash memory incapable of a data overwriting.

For example, when host 10A instructs to rewrite data at logic address LA1, semiconductor storage device 10B cannot directly rewrite data at physical address PA1 allocated to logic address LA1. That is, semiconductor storage device 10B changes the data at physical address PA1 allocated to logic address LA1 to invalid data, and writes update data to physical address PA2 different from physical address PA1.

When such processing continues, active blocks in which valid data and invalid data mix are generated.

Only the valid data of the active blocks are put together and rewritten in one free block (compaction), thereby releasing the active blocks as free blocks. This allows to suppress an abrupt decrease in the free space (free blocks) caused by an increase in the data rewrite count.

However, it is important to appropriately set the condition to execute the compaction. This is because when the compaction is executed during writing, the write speed (write efficiency) considerably lowers, as already described.

For example, the condition of the compaction is changed depending on whether a writing is progressing.

Whether a writing is progressing can be judged by, for example, confirming interval Int of write commands based on the information of interval check part (for example, timer) 26 described above.

That is, when the interval of write commands is smaller than predetermined value Ith, for example, when the count value of the timer is smaller than the predetermined value, it is judged that a writing is progressing.

In this case, compaction part 25 executes a compaction when number Fcount of free blocks in storage memory 13 is smaller than second threshold value Fth2. In addition, compaction part 25 continues the compaction until number Fcount of free blocks in storage memory 13 is equal to or larger than second threshold value Fth2.

Note that first threshold value Fth1 used to judge whether data is time-continuous data is preferably equal to or smaller than second threshold value Fth2 that is the condition to execute the compaction.

When the interval of write commands is equal to or larger than predetermined value Ith, for example, when the count value of the timer is equal to or larger than the predetermined value, it is judged that a writing is not progressing (the state is the idle state after the writing).

In this case, compaction part 25 executes a compaction when number Fcount of free blocks in storage memory 13 is smaller than third threshold value Fth3. In addition, compaction part 25 continues the compaction until number Fcount of free blocks in storage memory 13 is equal to or larger than third threshold value Fth3.

Note that third threshold value Fth3 in the idle state is preferably larger than second threshold value Fth2 of the compaction during writing. That is, free blocks are generated as many as possible after the end of the first writing before the start of the second writing, thereby preventing occurrence of a compaction during the second writing and improving the write speed (write efficiency).

Free block offer part 23 determines the free block in storage memory 13 to put together valid data at the time of the compaction based on the management information of block management part 27.

Block management part 27 updates the statement of the free block used to put together the valid data at the time of the compaction. For example, when the valid data is written in the free block in the MLC-mode at the time of the compaction, the statement of the block is changed from F (Free block) to M (MLC-active block).

In addition, block management part 27 updates the statement of each active block (SLC/MLC-active block) that is the valid data offer source at the time of the compaction. This is because the active blocks include only invalid data after the compaction. That is, the statement of the active block is changed from M (MLC-active block) or S (SLC-active block) to F (Free block).

Note that as for a free block including only invalid data, after the free block has changed to that state, the invalid data is erased by the block erase operation to return the free block to the initial state before writing new data in it.

FIG. 2 shows the concept of block management according to this embodiment. FIG. 3 shows a block management table.

In this embodiment, whether to perform a writing in the storage memory in the MLC-mode or SLC-mode is determined based on whether data is time-continuous data, for example, whether the number of free blocks is smaller than a predetermined value.

A writing in the MLC-mode or a writing in the SLC-mode can be managed, for example, on the block basis. In this case, as shown in FIG. 3, the block management table stores block numbers 1, 2, 3, . . . , n and statements (S, M, F) of the blocks.

However, a writing in the MLC-mode or a writing in the SLC-mode may be managed based on a unit smaller than the block, for example, on the page, sector, or frame basis.

Write part 24 writes data from the host in free block F offered by free block offer part 23 based on information from mode selection part 22.

When the data is written in the free block in the SLC-mode, block management part 27 changes the statement of the free block from F (Free block) to S (SLC-active block). When the data is written in the free block in the MLC-mode, block management part 27 changes the statement of the free block from F (Free block) to M (MLC-active block).

Compaction targets are selected from the active blocks (SLC/MLC-active blocks). After the compaction, the active blocks as the compaction targets are released and changed to free blocks F.

Free block offer part 23 offers free block F to write part 24 or compaction part 25 based on the management information (for example, the block management table in FIG. 3) of block management part 27.

Compaction part 25 writes data from the compaction targets (active blocks as the valid data offer source) in free block F offered by free block offer part 23.

When the data are written in the free block in the MLC-mode at the time of the compaction, block management part 27 changes the statement of the free block from F (Free block) to M (MLC-active block).

Figure 4:
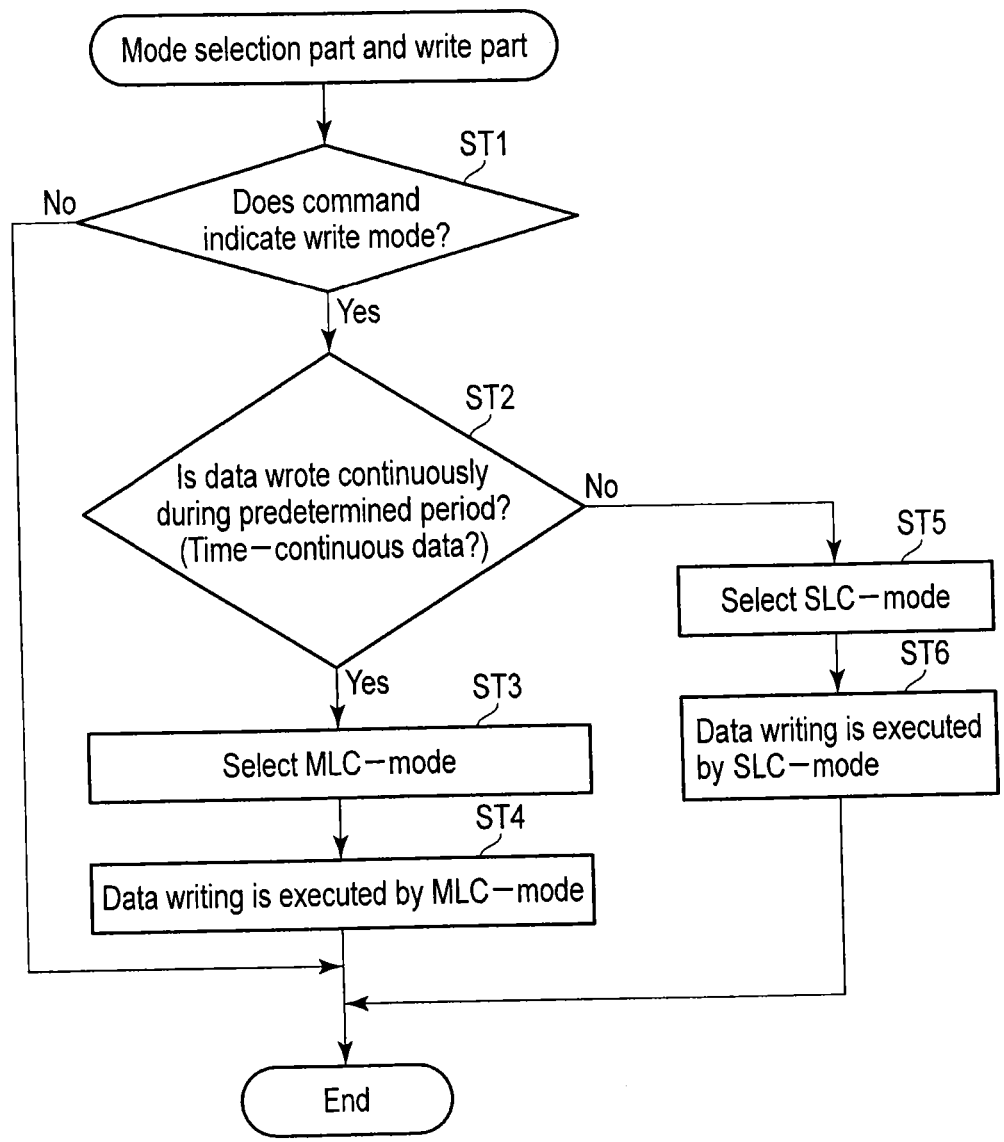
FIG. 4 is a flowchart showing a mode selection part and a write part.

FIG. 4 shows the first example of control by the controller.

This control is associated with mode selection part 22 and write part 24 shown in FIG. 1.

First, it is checked whether a command indicates a write mode (step ST1). When the command indicates the write mode, it is checked whether data is written in the buffer memory continuously during a predetermined period, that is, whether data from the host is time-continuous data (step ST2).

When the data from the host is time-continuous data, the MLC-mode is selected (step ST3), and the data is written in the storage memory by the MLC-mode (step ST4).

If the data from the host is not time-continuous data, the SLC-mode is selected (step ST5), and the data is written in the storage memory by the SLC-mode (step ST6).

In this way, the SLC-mode or MLC-mode is selected based on whether the data is time-continuous data. This makes it possible to prevent occurrence of a compaction during writing and improve the write speed (write efficiency).

FIG. 5 shows the second example of control by the controller.

This control is associated with mode selection part 22 shown in FIG. 1.

First, it is checked whether number Fcount of free blocks as a free space in the storage memory is smaller than first threshold value Fth1 (step ST1).

When number Fcount of free blocks is smaller than first threshold value Fth1, it is determined that data from the host is time-continuous data (step ST2).

When number Fcount of free blocks is not smaller than first threshold value Fth1, it is determined that data from the host is not time-continuous data (step ST3).

In this way, whether the data from the host is time-continuous data is judged based on number Fcount of free blocks in the storage memory. This allows to decrease the overhead needed for the judgment and improve the write speed (write efficiency).

FIG. 6 shows the third example of control by the controller.

This control is associated with mode selection part 22 shown in FIG. 1.

First, it is checked whether interval Int of write commands is shorter than predetermined value (threshold value) Ith (step ST1).

When interval Int of write commands is shorter than predetermined value Ith, it is determined that data from the host is time-continuous data (step ST2).

When interval Int of write commands is not shorter than predetermined value Ith, it is determined that data from the host is not time-continuous data (step ST3).

Note that interval Int of write commands can be checked by, for example, a timer. That is, the count value of the timer is reset every time a write command is decoded, and the count value of the timer at the time of decoding the write command is confirmed, thereby confirming interval Int of write commands.

In this way, whether the data from the host is time-continuous data is judged based on interval Int of write commands. This allows to decrease the overhead needed for the judgment and improve the write speed (write efficiency).

Figure 7:
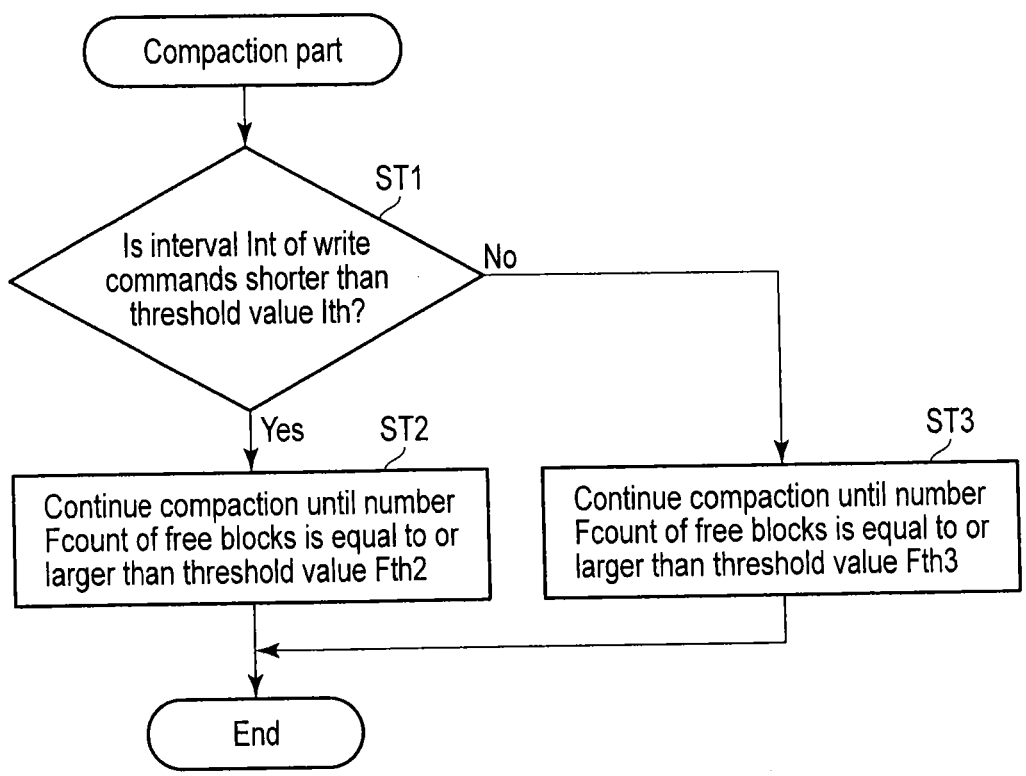
FIGS. 7 and 8 are flowcharts showing a compaction part.

FIG. 7 shows the fourth example of control by the controller.

This control is associated with compaction part 25 shown in FIG. 1.

First, it is checked whether interval Int of write commands is shorter than predetermined value (threshold value) Ith (step ST1).

When interval Int of write commands is shorter than predetermined value Ith, for example, when the count value of the timer is smaller than the predetermined value, it is determined that a writing is progressing.

In this case, if the number of free blocks in the storage memory is smaller than second threshold value Fth2, a compaction is executed. The compaction is continued until the number of free blocks in the storage memory is equal to or larger than second threshold value Fth2 (step ST2).

When interval Int of write commands is not shorter than predetermined value Ith, for example, when the count value of the timer is equal to or larger than the predetermined value, it is determined that the state is the idle state after the writing.

In this case, if the number of free blocks in the storage memory is smaller than third threshold value Fth3, a compaction is executed. The compaction is continued until the number of free blocks in the storage memory is equal to or larger than third threshold value Fth3 (step ST3).

Note that when the third threshold value Fth3 is made larger than second threshold value Fth2, it is possible to prevent occurrence of a compaction at the time of the writing and generate more free blocks at the time of idle.

In this way, whether a writing is progressing is judged, and the condition of the compaction is changed based on interval Int of write commands (for example, the count value of the timer). This allows to prevent occurrence of a compaction during writing and improve the write speed (write efficiency).

Figure 8:
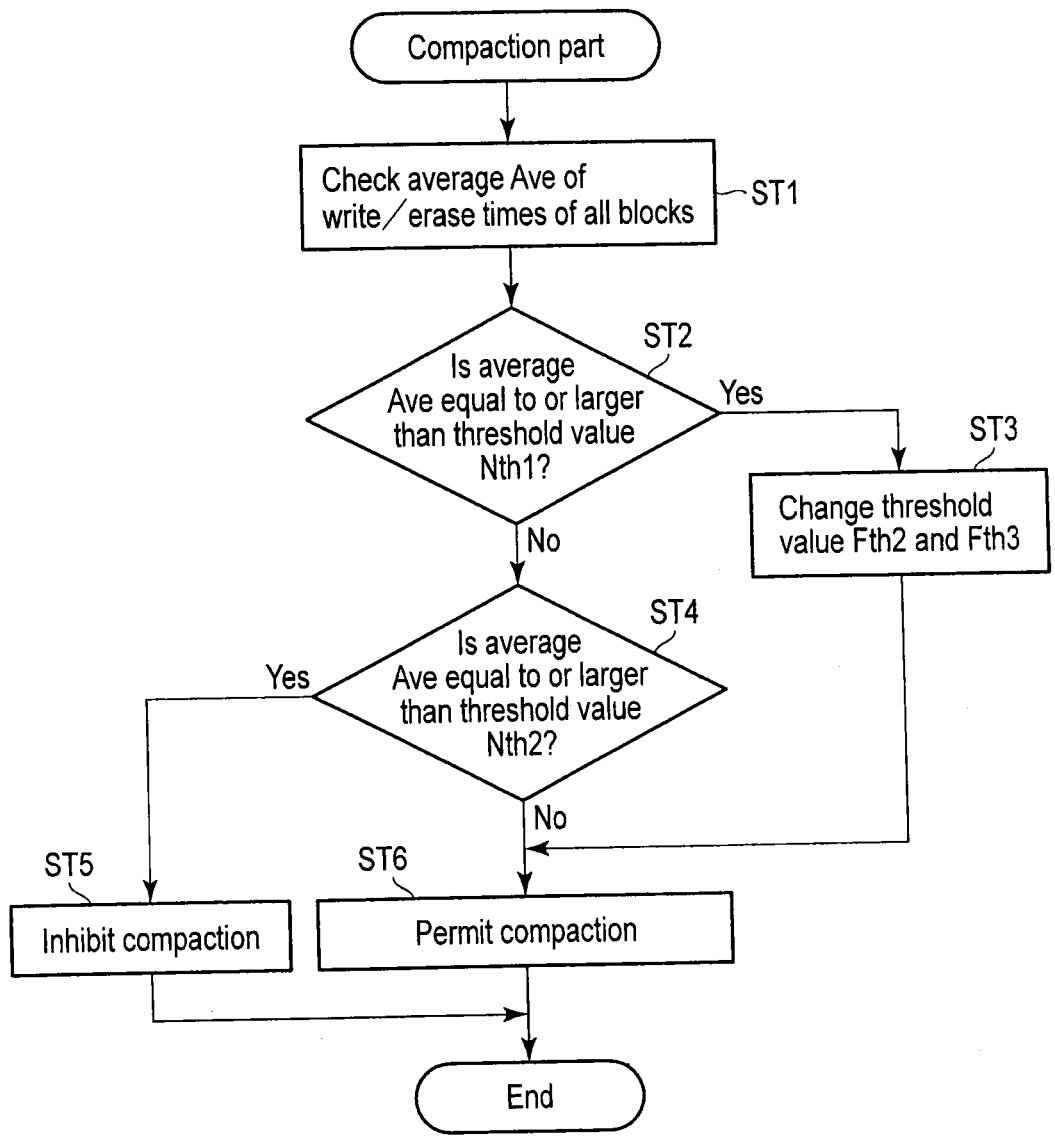

FIG. 8 shows the fifth example of control by the controller.

This control is associated with compaction part 25 shown in FIG. 1.

First, average Ave of write/erase times of all blocks in the storage memory is checked (step ST1).

When average Ave of write/erase times is equal to or larger than predetermined value (threshold value) Nth1, it is judged that the blocks in the storage memory have deteriorated over time (step ST2). If a compaction is executed in this state, the blocks in the storage memory become faulty (change to unusable bad blocks) at a high probability.

Hence, in this case, the condition of the compaction is relaxed.

For example, when average Ave of write/erase times is equal to or larger than predetermined value (threshold value) Nth1, at least one of second threshold value Fth2 and third threshold value Fth3 is made small (step ST3).

Thus changing at least one of second threshold value Fth2 and third threshold value Fth3 based on average Ave of write/erase times enables to relax the condition of the compaction and suppress generation of bad blocks.

When average Ave of write/erase times is equal to or larger than predetermined value (threshold value) Nth2, it is judged that the blocks in the storage memory have considerably deteriorated over time (step ST4). However, predetermined value Nth2 is larger than predetermined value Nth1.

If a compaction is executed in this state, the blocks in the storage memory become faulty at a higher probability.

Hence, in this case, the condition is inhibited.

For example, when average Ave of write/erase times is equal to or larger than predetermined value (threshold value) Nth2, a compaction is inhibited (step ST5). On the other hand, when average Ave of write/erase times is smaller than predetermined value (threshold value) Nth2, a compaction is permitted (step ST6).

In this way, when average Ave of write/erase times is equal to or larger than predetermined value Nth2, the condition is inhibited. This allows to suppress generation of bad blocks.

Note that average Ave of write/erase times used as the criterion to judge permission/inhibition of the compaction is merely an example. That is, permission/inhibition of the compaction may be judged using not average Ave of write/erase times but, for example, the sum of write/erase times or the write/erase times of an arbitrary block as the criterion.

Figure 9:
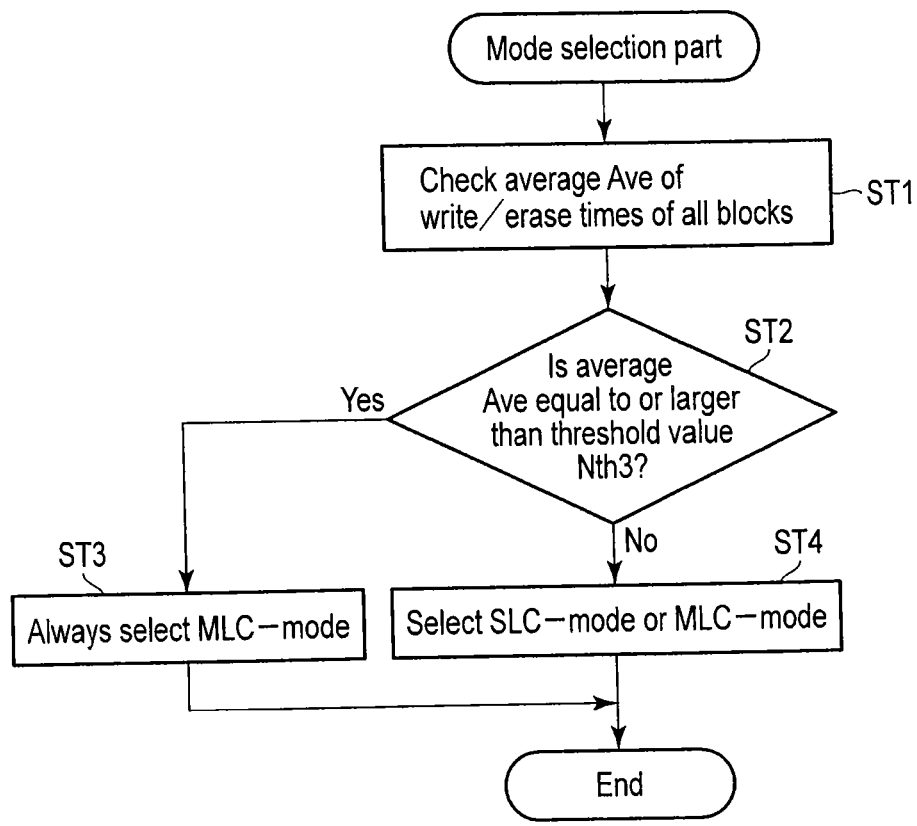
FIG. 9 is a flowchart showing the mode selection part.

FIG. 9 shows the sixth example of control by the controller.

This control is associated with mode selection part 22 shown in FIG. 1.

First, average Ave of write/erase times of all blocks in the storage memory is checked (step ST1).

When average Ave of write/erase times is equal to or larger than predetermined value (threshold value) Nth3, it is judged that the blocks in the storage memory have deteriorated over time (step ST2). If a compaction is executed in this state, the blocks in the storage memory become faulty at a high probability.

Hence, in this case, the MLC-mode in which the compaction rarely occurs is always selected (step ST3). That is, when average Ave of write/erase times is equal to or larger than predetermined value (threshold value) Nth3, the MLC-mode is always selected independently of whether data from the host is time-continuous data or whether the number of free blocks is smaller than a predetermined value.

On the other hand, when average Ave of write/erase times is smaller than predetermined value (threshold value) Nth3, one of the MLC-mode and the SLC-mode is selected based on whether data from the host is time-continuous data or whether the number of free blocks is smaller than a predetermined value, as described above (step ST4).

In this way, when average Ave of write/erase times is equal to or larger than predetermined value Nth3, the MLC-mode is always selected independently of whether data from the host is time-continuous data. This allows to suppress generation of bad blocks.

Note that average Ave of write/erase times used as the criterion to judge selection of MLC/SLC-mode is merely an example. That is, selection of MLC/SLC-mode may be judged using not average Ave of write/erase times but, for example, the sum of write/erase times or the write/erase times of an arbitrary block as the criterion.

FIG. 10 shows a block management table.

This block management table is used for control shown in FIGS. 8 and 9. That is, the block management table stores block numbers 1, 2, 3, . . . , n and statements (S, M, F) and numbers of write/erase times of the blocks.

In this case, average Ave of write/erase times is (N1+N2+ . . . Nn)/n.

The number of write/erase times of each of the blocks in the storage memory is thus managed by the block management table. This facilitates the control shown in FIGS. 8 and 9.

Figure 11:
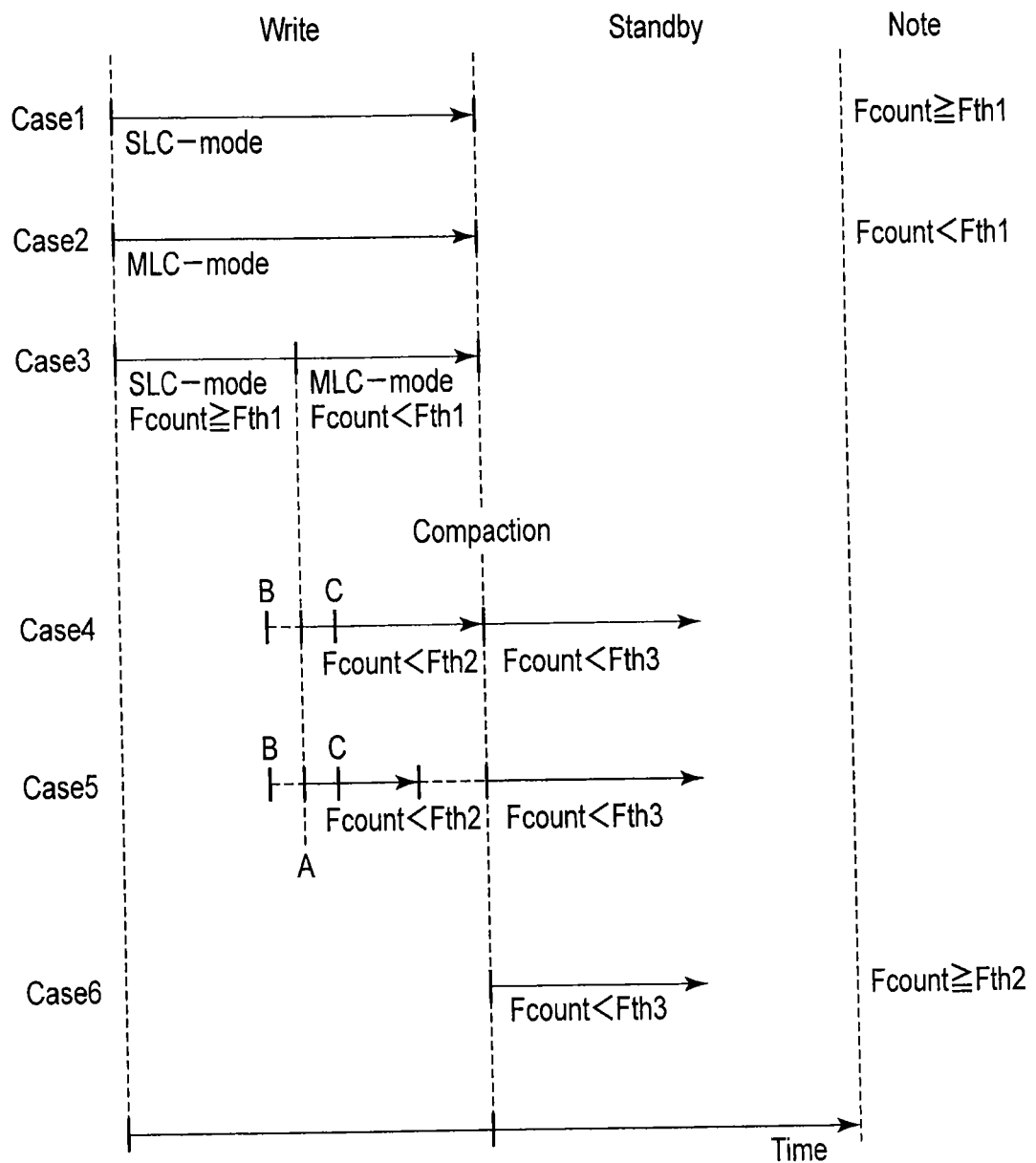
FIG. 11 is a view showing an example of selection of an SLC-mode and an MLC-mode.

FIG. 11 shows the relationship between mode switching and a compaction.

Cases 1 to 3 represent the conditions to select the MLC-mode and the SLC-mode. Each solid arrow indicates the period during which a writing is performed in the MLC-mode or SLC-mode.

Case 1 is an example in which a writing is always executed in the SLC-mode because Fcount Fth1 always holds during writing.

Case 2 is an example in which a writing is always executed in the MLC-mode because Fcount<Fth1 always holds during writing.

Case 3 is an example in which the first half of a writing is executed in the SLC-mode because Fcount≥Fth1 holds, and the second half of the writing is executed in the MLC-mode because Fcount<Fth1 holds.

Cases 4 to 6 represent the conditions of a compaction that occurs at the time of the writing or in the idle state after that in Cases 1 to 3. Each solid arrow indicates the period during which a compaction occurs.

Case 4 is an example in which Fcount<Fth2 holds during writing in Cases 1 to 3, and a compaction occurs during writing in Cases 1 to 3.

For example, when Fcount<Fth2 holds during writing (point B) in the SLC-mode in Case 3, a compaction occurs from that point of time. When Fcount<Fth2 holds during writing (point C) in the MLC-mode in Case 3, a compaction occurs from that point of time. When Fcount<Fth2 holds at the boundary (point A) between the SLC-mode and the MLC-mode in Case 3, a compaction occurs from that point of time.

Case 4 is also an example in which Fcount<Fth3 holds in the idle state after the writing (for example, when the count value of the timer is equal to or larger than a predetermined value), and the compaction continuously occurs even during the idle state after the writing.

Case 5 is an example in which Fcount<Fth2 holds during writing in Cases 1 to 3, and a compaction occurs during writing in Cases 1 to 3. Case 5 is also an example in which Fcount≥Fth2 holds during writing in Cases 1 to 3, and the compaction ends during writing.

Note that the point of time (point A, B, or C) at which the compaction occurs during writing is the same as in Case 4, and a description thereof will be omitted here.

Case 5 is also an example in which Fcount<Fth3 holds in the idle state after the writing (for example, when the count value of the timer is equal to or larger than a predetermined value), and the compaction occurs again in the idle state.

Case 6 is an example in which although no compaction occurs during writing, Fcount<Fth3 holds in the idle state after the writing (for example, when the count value of the timer is equal to or larger than a predetermined value), and a compaction occurs in the idle state.

4. APPLICATION EXAMPLE

An application example of the memory system described in the above embodiment will be explained.

This memory system is applicable to, for example, an enterprise SSD (Solid State Drive) of a server or the like, a client SSD of a notebook computer or the like, and a nearline SSD between them.

Figure 12:
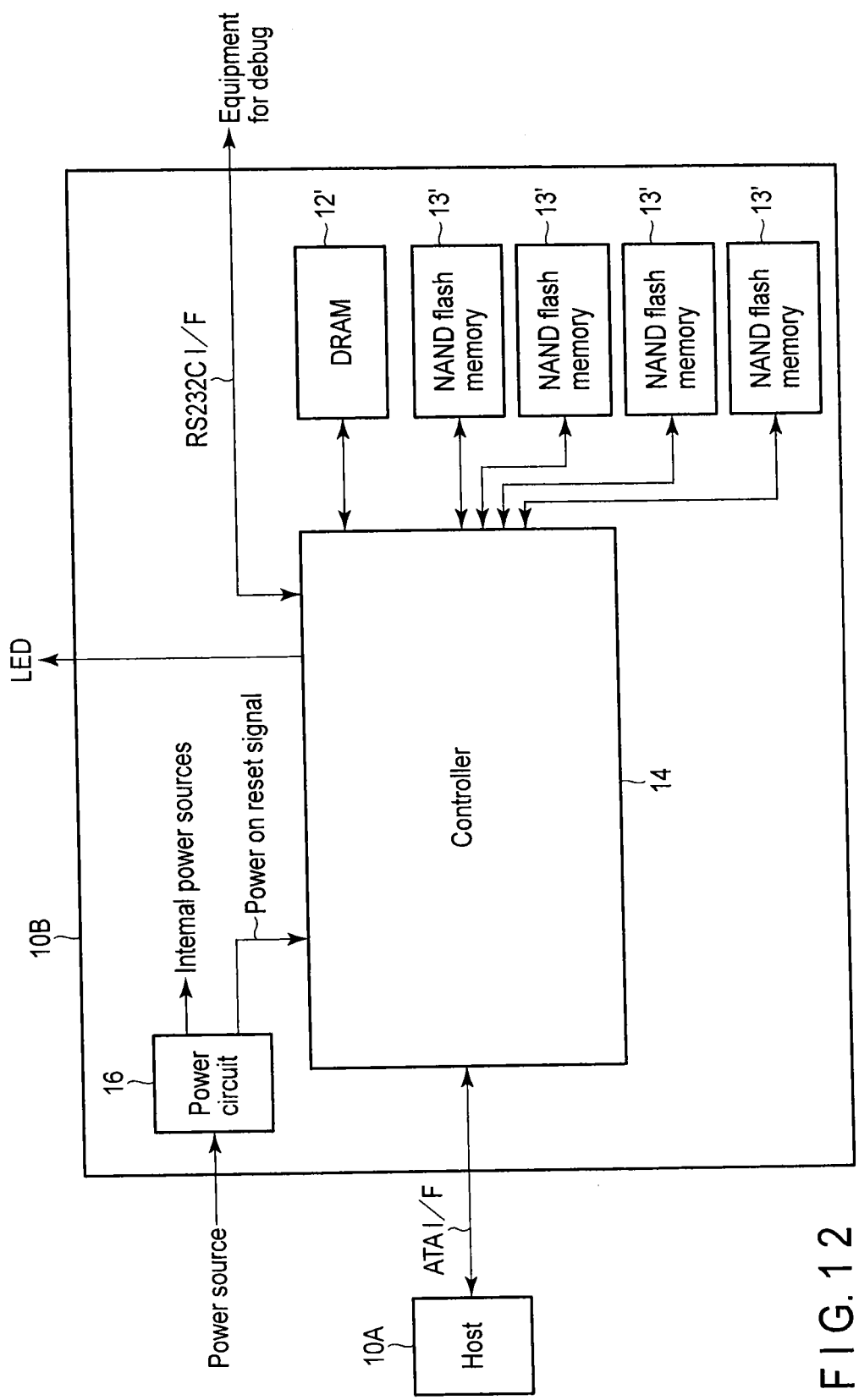
FIG. 12 is a block diagram showing an SSD.

FIG. 12 shows an example of the arrangement of an SSD.

The SSD serving as semiconductor storage device 10B includes DRAM (buffer memory) 12', NAND flash memory (storage memory) 13', controller 14 that controls DRAM 12' and NAND flash memory 13', and power circuit 16.

In this example, for example, DRAM 12' corresponds to buffer memory 12 in FIG. 1, and NAND flash memory 13' corresponds to storage memory 13 in FIG. 1.

However, DRAM 12' serving as a buffer memory may be changed to an FeRAM (Ferro electric Random Access Memory), an MRAM (Magnetic Random Access Memory), a NOR flash memory, or the like. That is, the buffer memory need only be a random access memory having a write speed higher than that of NAND flash memory 13' serving as a storage memory.

Controller 14 outputs a control signal to control an LED provided outside semiconductor storage device 10B.

Semiconductor storage device 10B is connected to host 10A such as a personal computer via an ATA interface (ATA I/F). Semiconductor storage device 10B is connected to equipment for debug via an RS232C interface (RS232C I/F).

Power circuit 16 receives an external power source and generates internal power sources using the external power source. These internal power sources are offered to the respective parts in semiconductor storage device 10B. Upon detecting the rise of the external power source, power circuit 16 generates a power on reset signal. The power on reset signal is sent to controller 14.

NAND flash memory 13' includes blocks. Each block is the minimum data erase unit.

Figure 13:
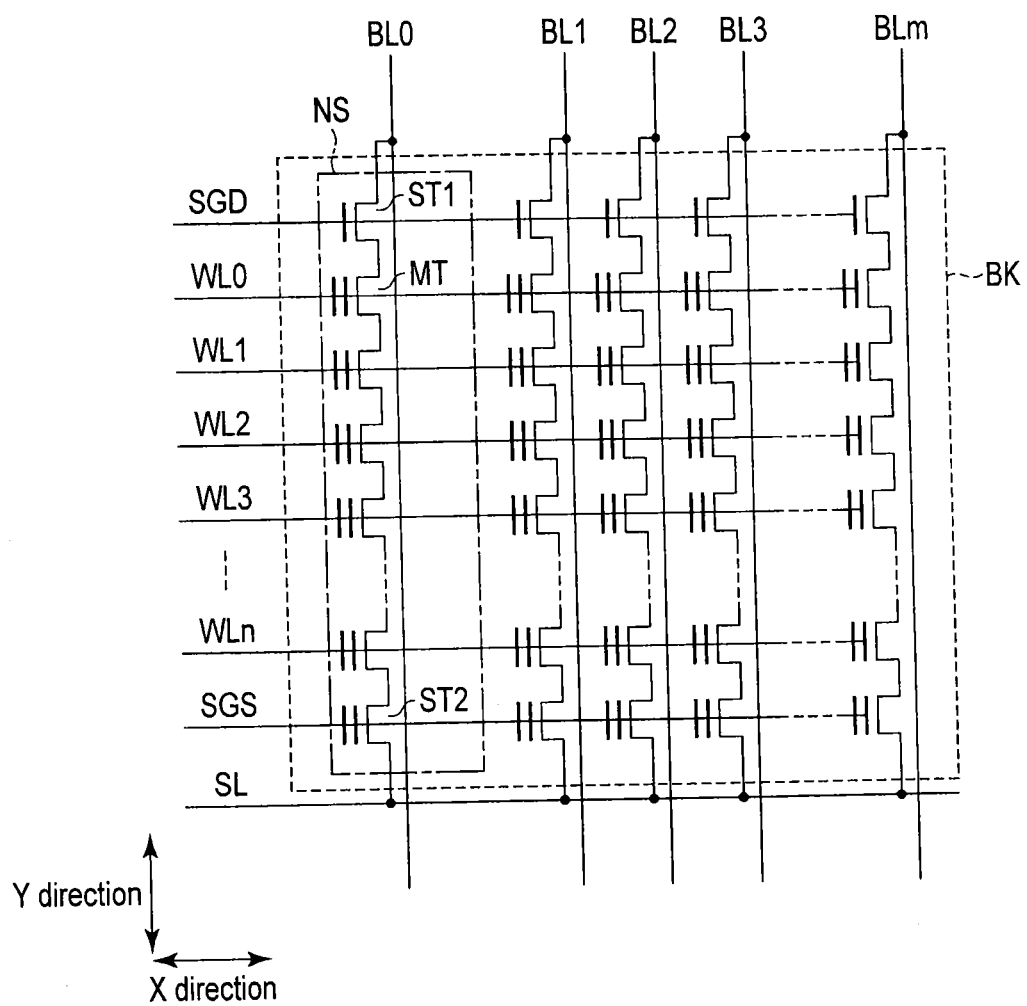
FIG. 13 is a circuit diagram showing a block of a NAND flash memory.

FIG. 13 shows an example of the structure of a block of the NAND flash memory.

Block BK includes (m+1) NAND strings NS arranged in the X direction and extending in the Y direction (m is an integer or 0 or more). Select transistor ST1 included in (m+1) NAND strings NS includes a drain connected to bit line BLj (j is one of 0 to m) and a gate connected to select gate line SGD. Select transistor ST2 included in (m+1) NAND strings NS includes a source connected to source line SL and a gate connected to select gate line SGS.

Memory cell transistor MT included in (m+1) NAND strings NS is a MOSFET (Metal Oxide Semiconductor Field Effect Transistor) having a stacked gate structure. The stacked gate structure includes a first insulating film on a semiconductor substrate, a charge accumulation layer (for example, floating gate electrode) on the first insulating film, a second insulating film on the charge accumulation layer, and a control gate electrode on the second insulating film. Memory cell transistor MT changes the threshold voltage in accordance with the number of electrons accumulated in the charge accumulation layer and stores data by the difference in the threshold voltage.

Memory cell transistor MT can be either an SLC (Single Level Cell) that stores 1-bit data or an MLC (Multi Level Cell) that stores data of 2 bits or more.

In each NAND string, (n+1) memory cell transistors MT are connected in series between the source of select transistor ST1 and the drain of select transistor ST2 (n is an integer of 0 or more). That is, two memory cell transistors MT adjacent to each other out of memory cell transistors MT share the source or drain.

The control gate electrodes of (n+1) memory cell transistors MT are connected to word lines WL0 to WLn, respectively.

Word lines WL0 to WLn extend in the X direction and are commonly connected to memory cell transistors MT in (m+1) NAND strings NS. (m+1) memory cell transistors MT connected to one word line will (i is one of 0 to n) store data based on a unit called a page. Data reading/writing is performed based on the unit called page.

NAND flash memories 13' are connected in parallel to controller 14. Data erase may be performed simultaneously for blocks in NAND flash memories 13'. An extended block that is the minimum erase unit of the SSD may include blocks in NAND flash memories 13'.

Data reading/writing may be performed simultaneously for pages in NAND flash memories 13'. An extended page that is the minimum read/write unit of the SSD may include pages in NAND flash memories 13'.

Memory cell transistor MT need not always have the structure including a floating gate electrode and may employ a structure such as a MONOS (Metal-Oxide-Nitride-Oxide-Silicon) structure in which an insulating layer (for example, silicon nitride layer) serving as a charge accumulation layer traps electrons.

In the MONOS structure as well, memory cell transistor MT can be either an SLC that stores 1-bit data or an MLC that stores data of 2 bits or more.

FIG. 14 shows an example of the threshold distribution of memory cells when one memory cell transistor is a 4-level cell that stores 2-bit data.

The 4-level cell can store lower page data (SLC-mode) or both lower and upper page data (MLC-mode) out of quaternary data "xy" defined by upper page data "x" and lower page data "y". The quaternary data are "11", "01", "00", and "10". Data "11" (erase state) indicates a state in which, for example, the threshold voltage of memory cell transistor MT is negative.

A lower page data writing is an operation of, for example, changing lower page data "y" from "1" to "0". When lower page data "y" is "1", the threshold value of the memory cell transistor is included in the threshold distribution of data "11". When lower page data "y" is "0", the threshold value of the memory cell transistor is included in the threshold distribution of data "10" (Hatching of "Write lower page" in FIG. 14).

An upper page data writing is an operation of, for example, changing upper page data "x" from "1" to "0". When lower page data "y" is "1", and upper page data "x" is "0", the threshold value of the memory cell transistor moves from the threshold distribution of data "11" to the threshold distribution of data "01". When lower page data "y" is "0", and upper page data "x" is "0", the threshold value of the memory cell transistor moves from the threshold distribution of data "10" to the threshold distribution of data "00".

When lower page data "y" is "0", and upper page data "x" is "1", the threshold value of the memory cell transistor moves from the threshold distribution of data "10" (Hatching of "Write lower page" in FIG. 14) to the threshold distribution of data "10" (Hatching of "Write upper page" in FIG. 14).

FIG. 15 shows an example of the arrangement of the controller.

Controller 14 includes data access bus 104, first circuit control bus 105, and second circuit control bus 106.

Processor 107 is connected to first circuit control bus 105. Boot ROM 108 that stores a management program (FW: firmware) is connected to first circuit control bus 105 via ROM controller 109. Clock controller 110 is connected to first circuit control bus 105. Clock controller 110 receives a power on reset signal from the power circuit, thereby generating a reset signal and a clock signal.

Second circuit control bus 106 is connected to first circuit control bus 105. Parallel IO (PIO) circuit 111 and serial IO (SIO) circuit 112 are connected to second circuit control bus 106. Parallel IO circuit 111 offers a status display signal to an LED. Serial IO circuit 112 controls an RS232C interface.

ATA interface controller (ATA controller) 113, first ECC (Error Check and Correct) circuit 114, NAND controller 115, and DRAM controller 119 are connected to both data access bus 104 and first circuit control bus 105. ATA controller 113 is connected to the host via an ATA interface. SRAM 120 is connected to data access bus 104 via SRAM controller 121.

NAND controller 115 includes NAND I/F 118, second ECC circuit 117, and DMA controller 116. NAND I/F 118 functions as the interface of the NAND flash memory. DMA controller 116 controls accesses between the NAND flash memory and the DRAM.

FIG. 16 shows an example of the arrangement of the processor.

Processor 107 includes data management part 122, ATA command processing part 123, security management part 124, boot loader 125, initialization management part 126, and debug support part 127.

Data management part 122 manages data transfer between the NAND flash memory and the DRAM via NAND controller 115 and first ECC circuit 114 or the functions of the NAND flash memory (chips).

Data management part 122 and ATA command processing part 123 perform data transfer processing via ATA controller 113 and DRAM controller 119. Security management part 124 manages security information in cooperation with data management part 122 and ATA command processing part 123. Boot loader 125 loads the management program (FW) from the NAND flash memory to SRAM 120.

Initialization management part 126 initializes the circuits in controller 14. Debug support part 127 processes debug data externally offered via the RS232C interface.

FIG. 17 shows an example of a portable computer including an SSD.

Portable computer 200 includes main body 201 and display unit 202. Display unit 202 includes display housing 203 and display device 204 stored in display housing 203.

Main body 201 includes case 205, keyboard 206, and touch pad 207 serving as a pointing device. Case 205 includes a main circuit board, an ODD (Optical Disk Device) unit, a card slot, SSD 100, and the like.

The card slot is provided adjacent to the surrounding wall of case 205. Opening 208 facing the card slot is provided in the surrounding wall. The user can insert an additional device from outside case 205 into the card slot through opening 208.

SSD 100 may replace a conventional HDD and be included in portable computer 200. Alternatively, SSD 100 may be inserted into the card slot of portable computer 200 and used as an additional device.

Figure 18:
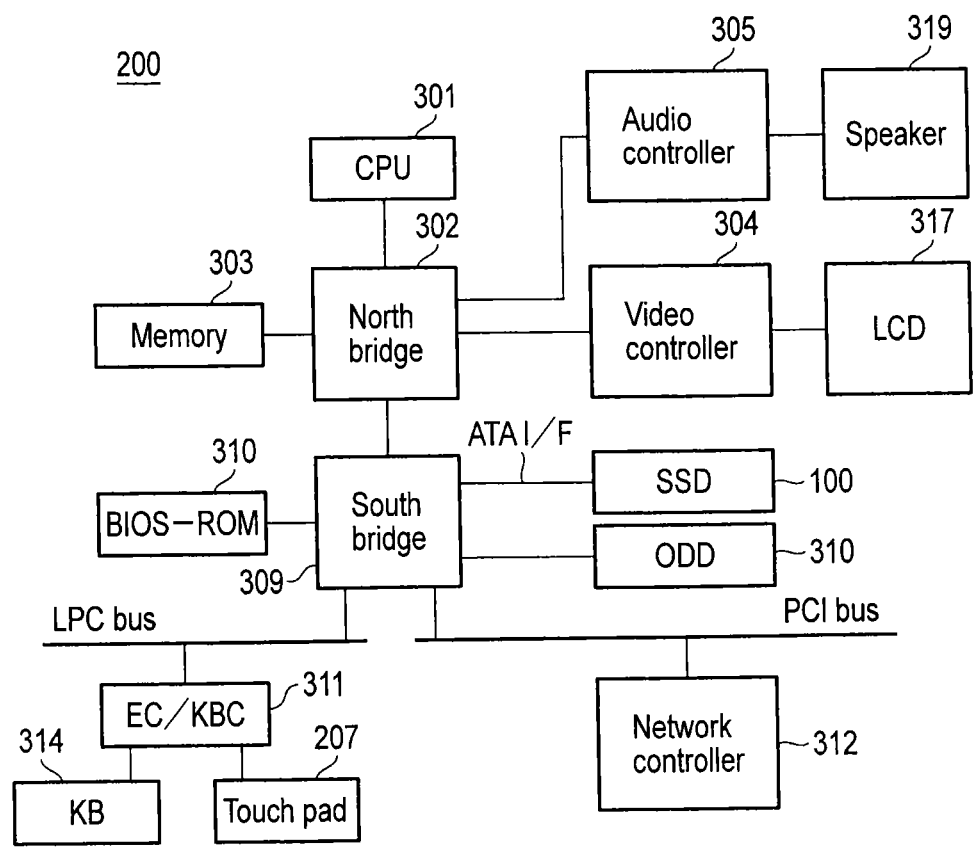
FIG. 18 is a block diagram showing a portable computer system.

FIG. 18 shows an example of the arrangement of a portable computer system including the SSD.

Portable computer 200 includes CPU 301, north bridge 302, main memory 303, video controller 304, audio controller 305, south bridge 309, BIOS-ROM 310, SSD 100, ODD unit 310, embedded controller/keyboard controller IC (EC/KBC) 311, and network controller 312.

CPU 301 is a processor provided to control the operation of the portable computer 200, and executes the OS (Operating System) loaded from the SSD 100 to main memory 303. When ODD unit 310 enables execution of at least one of read processing and write processing for a loaded optical disk, CPU 301 executes the processing.

CPU 301 also executes the system BIOS (Basic Input Output System) stored in BIOS-ROM 310. The system BIOS is a program for hardware control in portable computer 200.

North bridge 302 is a bridge device that connects south bridge 309 and the local bus of CPU 301. North bridge 302 also incorporates a memory controller that controls access to main memory 303.

North bridge 302 has a function of executing communication with video controller 304 and audio controller 305 via an AGP (Accelerated Graphics Port) bus and the like.

Main memory 303 temporarily stores programs and data and functions as the work area of CPU 301. Main memory 303 is formed from, for example, a DRAM.

Video controller 304 is a video reproduction controller that controls the display unit used as display monitor (LCD) 317 of portable computer 200.

Audio controller 305 is an audio reproduction controller that controls speaker 319 of portable computer 200.

South bridge 309 controls each device on the LPC (Low Pin Count) bus and each device on the PCI (Peripheral Component Interconnect) bus. South bridge 309 controls, via the ATA interface, SSD 100 serving as a storage device that stores of software and data.

Portable computer 200 accesses the SSD 100 for each sector. A write command, a read command, a flash command, and the like are input to SSD 100 via the ATA interface.

South bridge 309 also has a function of controlling access to BIOS-ROM 310 and ODD unit 310.

EC/KBC 311 is a 1-chip microcomputer on which an embedded controller for power management and a keyboard controller used to control keyboard (KB) 314 and touch pad 207 are integrated.

EC/KBC 311 has a function of powering on/off portable computer 200 in accordance with a user operation on the power button. Network controller 312 is a communication device that executes communication with an external network such as the Internet.

The memory system described in the above embodiment is applicable not only to the SSD but also to, for example, a memory card represented by an SD® card. The memory system described in the above embodiment is applicable to various kinds of electronic devices such as a portable computer, a cellular phone, a PDA (personal digital assistant), a digital still camera, and a digital video camera.

5. CONCLUSION

According to the embodiment, whether to do a writing in the MLC-mode or SLC-mode is determined based on whether data to be written from the host to a nonvolatile memory is time-continuous data, thereby improving the write speed (write efficiency). Since whether data is time-continuous data can simply be judged by the number of free blocks, no overhead for the judgment occurs.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory controller configured to control a storage memory, the memory controller comprising:
   a command decode part;
   a mode selection part that selects one of a MLC-mode and a SLC-mode, after a write command is decoded by the command decode part; and
   a write part that executes a data writing to the storage memory by using one of the MLC-mode and the SLC-mode selected by the mode selection part,
   wherein the mode selection part is configured to:
   check whether a first data written from a host to a buffer memory is a time-continuous data that is written continuously during a predetermined period;
   execute the data writing of a second data from the buffer memory to the storage memory in the MLC-mode, when the first data is the time-continuous data; and
   execute the data writing of the second data from the buffer memory to the storage memory in the SLC-mode, when the first data is not the time-continuous data.

2. The controller of claim 1,
wherein the mode selection part is configured to:
determine that the first data is the time-continuous data, when a number of free blocks as a free space in the storage memory is smaller than a first threshold value.

3. The controller of claim 2, further comprising:
a compaction part that executes a compaction of a third data written in the storage memory, and
an interval check part that checks an interval of write commands from the host,
wherein the compaction part is configured to:
continue the compaction until the number of the free blocks in the storage memory is equal to or larger than a second threshold value, when the interval is smaller than a predetermined value.

4. The controller of claim 3,
wherein the first threshold value is equal to or smaller than the second threshold value.

5. The controller of claim 3,
wherein the compaction part is configured to:
continue the compaction until the number of the free blocks in the storage memory is equal to or larger than a third threshold value larger than the second threshold value, when the interval of the write commands from the host is equal to or larger than the predetermined value.

6. The controller of claim 5,
wherein the compaction part is configured to:
reduce at least one of the second and third threshold value, when an average of write/erase times of all blocks in the storage memory is equal to or larger than a predetermined value.

7. The controller of claim 5,
wherein the compaction part is configured to:
inhibit the compaction, when an average of write/erase times of all blocks in the storage memory is equal to or larger than a predetermined value.

8. The controller of claim 1,
wherein the mode selection part is configured to:
determine that the first data is the time-continuous data, when an interval of write commands from the host is smaller than a predetermined value.

9. The controller of claim 1,
wherein the mode selection part is configured to:
always select the MLC-mode, when an average of write/erase times of all blocks in the storage memory is equal to or larger than a predetermined value.

10. The controller of claim 1,
further comprising a block management part that is configured to:
categorize each of all blocks in the storage memory as one of three statements of a SLC-active block, a MLC-active block and a free block, and
manage the three statements by a block management table.

11. The controller of claim 1,
further comprising a block management part that is configured to:
manage a number of write/erase times of each of all blocks in the storage memory by a block management table.

12. A semiconductor storage device comprising:
the memory controller of claim 1;
the buffer memory that temporary stores the first data from the host; and
the storage memory that stores the second data from the buffer memory,
wherein the controller controls the buffer memory and the storage memory.

13. The device of claim 12,
wherein the buffer memory is a RAM with a write speed faster than that of the storage memory.

14. The device of claim 12,
wherein the storage memory is a NAND flash memory.

15. A method of controlling a data writing using the controller of claim 1, the method comprising:
checking whether a first data written from a host to a buffer memory is a time-continuous data that is written continuously during a predetermined period;
executing the data writing of a second data from the buffer memory to the storage memory in the MLC-mode, when the first data is the time-continuous data; and
executing the data writing of the second data from the buffer memory to the storage memory in the SLC-mode, when the first data is not the time-continuous data.

16. The method of claim 15, further comprising:
determining that the first data is the time-continuous data, when a number of free blocks as a free space in the storage memory is smaller than a first threshold value.

17. The method of claim 16, further comprising:
continuing the compaction until the number of the free blocks in the storage memory is equal to or larger than a second threshold value, when an interval of write commands from the host is smaller than a predetermined value.

18. The method of claim 17,
wherein the first threshold value is equal to or smaller than the second threshold value.

19. The method of claim 17, further comprising:
continuing the compaction until the number of the free blocks in the storage memory is equal to or larger than a third threshold value larger than the second threshold value, when the interval of the write commands from the host is equal to or larger than the predetermined value.

20. The method of claim 15, further comprising:
determining that the first data is the time-continuous data, when an interval of write commands from the host is smaller than a predetermined value.

* * * * *